US006937082B2

(12) United States Patent
Ishimi

(10) Patent No.: US 6,937,082 B2
(45) Date of Patent: Aug. 30, 2005

(54) INFORMATION PROCESSING APPARATUS WITH CLOCK GENERATING CIRCUIT AND INFORMATION PROCESSING APPARATUS WITH CLOCK DELAYING CIRCUIT

(75) Inventor: Koichi Ishimi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 9 days.

(21) Appl. No.: 10/646,823

(22) Filed: Aug. 25, 2003

(65) Prior Publication Data

US 2004/0196086 A1 Oct. 7, 2004

(30) Foreign Application Priority Data

Nov. 18, 2002 (JP) ........................................ 2002-334116

(51) Int. Cl.[7] ................................................ G06F 1/04
(52) U.S. Cl. ........................ 327/291; 327/116; 327/119; 327/160
(58) Field of Search ................................ 327/116, 119, 327/146, 147, 149, 151, 158, 153–156, 160–163, 291–294; 331/25, 34, 53, DIG. 2; 375/373–376

(56) References Cited

U.S. PATENT DOCUMENTS

| 5,604,775 | A | | 2/1997 | Saitoh et al. | |
|---|---|---|---|---|---|
| 5,687,202 | A | | 11/1997 | Eitrheim | |
| 5,771,264 | A | * | 6/1998 | Lane | 375/376 |
| 5,995,441 | A | | 11/1999 | Kato et al. | |
| 6,049,238 | A | | 4/2000 | Shimizu et al. | |
| 6,157,226 | A | * | 12/2000 | Ishimi | 327/116 |
| 6,225,840 | B1 | * | 5/2001 | Ishimi | 327/116 |
| 6,330,197 | B1 | * | 12/2001 | Currin et al. | 365/194 |
| 6,348,823 | B1 | | 2/2002 | Pan | |
| 6,366,150 | B1 | | 4/2002 | Ishimi | |
| 6,424,193 | B1 | * | 7/2002 | Hwang | 327/158 |
| 6,441,662 | B2 | * | 8/2002 | Ikeda | 327/160 |
| 6,493,829 | B1 | * | 12/2002 | Kubo | 713/500 |
| 6,633,190 | B1 | * | 10/2003 | Alvandpour et al. | 327/291 |
| 6,639,958 | B1 | * | 10/2003 | Hohler et al. | 375/376 |
| 6,642,762 | B2 | * | 11/2003 | von Kaenel | 327/158 |
| 6,690,525 | B2 | * | 2/2004 | Ruegg et al. | 360/51 |

FOREIGN PATENT DOCUMENTS

| JP | 11-340823 | 12/1999 |
|---|---|---|
| JP | 2000-244309 A | 9/2000 |
| TW | 87117701 | 10/1998 |
| TW | 88110960 | 6/1999 |
| WO | PCT/WO85/02275 | 5/1985 |

OTHER PUBLICATIONS

Kouichi Ishimi et al., "A Full–Digital PLL for Low Voltage LSis", Technical Report of IEICE, The Institute of Electronics, Information and Communication Engineers, ED97–45, SDM97–23, ICD97–35, Jun. 1997, pp. 29–36.

Michel Cmobes et al., "A Portable Clock Multiplier Generator Using Digital CMOS Standard Cells" IEEE Journal of Solid–State Circuits, vol. 31, No. 7, Jul. 1996, pp. 958–965.

* cited by examiner

Primary Examiner—Timothy P. Callahan
Assistant Examiner—Hai L. Nguyen
(74) Attorney, Agent, or Firm—McDermott Will & Emery LLP

(57) ABSTRACT

A multiplication circuit and a phase synchronization circuit as components of a digital PLL circuit adjust an oscillation frequency and a phase, respectively, of a multiplied clock by adjusting a count value of a digital counter. A CPU sets a count value for oscillating an oscillation circuit of the multiplication circuit at a frequency which is the same as that of a reference clock or is a multiple of the frequency of the reference clock in a digital counter of the multiplication circuit in accordance with a program set by the user of the information processing apparatus, and sets a count value for synchronizing the phase of an output clock with the phase of the reference clock in a digital counter of the phase synchronization circuit.

20 Claims, 14 Drawing Sheets

INFORMATION PROCESSING APPARATUS WITH CLOCK GENERATING CIRCUIT AND INFORMATION PROCESSING APPARATUS WITH CLOCK DELAYING CIRCUIT

BACKGROUND OF THE INVENTION

1. Field of the Invention

The present invention relates to an information processing apparatus having a clock generating circuit and an information processing apparatus having a clock delaying circuit. More particularly, the present invention relates to an information processing apparatus having a clock generating circuit for controlling an oscillation frequency and the phase of an output clock by controlling a digital counter, and an information processing apparatus having a clock delaying circuit for controlling the phase of an output clock by controlling a digital counter.

2. Description of the Background Art

In association with an increase in the processing speed of an information processing apparatus of recent years, a PLL (Phase Locked Loop) circuit for generating a clock having the same frequency as a reference clock or a frequency which is a multiple of the frequency of the reference clock, synchronized with the reference clock is an indispensable circuit as a clock generating circuit in an information processing apparatus for performing a high-speed synchronizing process.

Conventionally, an analog PLL circuit for controlling oscillation frequency by controlling the voltage of a capacitor for holding a control voltage of a voltage controlled oscillation circuit (VCO) is widely used. However, it is difficult for the analog PLL circuit to perform control with a low voltage which is requested to the information processing apparatus of recent years. The analog PLL circuit has drawbacks such that it is sensitive to noise and it has very long waiting time until the operation is stabilized (a state in which the operation is stabilized is also referred to as a "locked state" and the waiting time until the lock state is obtained is also referred to as "lock time").

As a technique for solving the drawbacks of the analog PLL circuit, a digital PLL circuit for controlling a delay amount of a delay circuit (hereinafter, also referred to as "delay line") in which a plurality of inverters are connected in series by using a digital counter to control an oscillation frequency and the phase of an output clock has been proposed by the present inventors herein (Kouichi Ishimi and two others, "A Full-Digital PLL for Low Voltage LSIs", Technical Report of IEICE, The Institute of Electronics, Information and Communication Engineers, ED97-45, SDM97-23, ICD97-35, pp. 29 to 36, June 1997).

In this digital PLL circuit, the count value of the digital counter before locking operation is zero (delay time of the delay line is the minimum) and is incremented by one every two cycles of a reference clock. The delay time of the delay line increases in proportional to the count value and, accordingly, the pulse width of an output clock increases. When the output clock becomes a predetermined multiple ratio of the reference clock, the PLL circuit is locked and increment of the count value is stopped.

Although the lock time has been improved as compared with that in the analog PLL circuit, there is still long waiting time. For example, when the digital counter is constructed by ten bits, 2048 cycles ($=2\times20^{10}$) are necessary at the maximum. In the case where the frequency is changed during operation of the PLL circuit or in the case where the PLL circuit is stopped in a low power mode, after that, the low power mode is canceled, and the PLL circuit is re-started, the locking operation has to be performed again. Each time the locking operation is performed, waiting time of the amount corresponding to the lock time occurs.

To deal with the problem, Japanese Patent Laying-Open No. 2000-244309 discloses a clock generating circuit capable of shortening lock time by providing a computing unit on the inside of a digital PLL circuit, calculating a count value in the locking operation by the computing unit, and setting the count value in a digital counter.

Japanese Patent Laying-Open No. 11-340823 discloses an information processing apparatus capable of monitoring a state value of a digital counter, that is, a phase adjustment value from an external diagnostic processor in order to diagnose whether an operation failure which occurs at the time of evaluating a system is caused by the PLL circuit or not.

As a circuit having a configuration similar to that of a digital PLL circuit, a DLL (Delay Locked Loop) circuit is generally known. In the case where an LSI is mounted on a system, the DLL circuit is a circuit for adjusting the phase of a system clock of the system on which the LSI is mounted and the phase of a clock supplied to an internal circuit of the LSI, and is provided on the inside of the LSI. For the DLL circuit as well, in a manner similar to the digital PLL circuit, a delay line in which a plurality of inverters are connected in series is provided. By controlling a delay amount of the delay line by using a digital counter, clock phase adjustment is performed.

In the case such that, if the lock time is long in the PLL circuit, the operating state of the PLL circuit is frequently changed such that the operation frequency is frequently changed or the circuit frequently shifts in a low power mode, deterioration in performance of the information processing apparatus is caused and power is consumed also in processes until a lock state is obtained, so that reduction in power consumption is checked.

The clock generating circuit (PLL circuit) disclosed in Japanese Patent Laying-Open No. 2000-244309 solves the problems. However, as a change in the operation state of the PLL circuit, there may be various changes according to the operation specification and operating environment of the information processing apparatus on which the PLL circuit is mounted such as a change in reference clock frequency, a change in a multiple ratio, a change in a power mode, a change in a power supply voltage, and a change in a temperature environment used. It is important that the user of the information processing apparatus can properly and flexibly makes settings of the PLL circuit in accordance with various changes in operating conditions.

The control range of the delay amount of the delay line is limited. When the necessary delay amount exceeds the control range, the PLL circuit operates erroneously. In a stationary state, the possibility that the delay amount exceeds the control range is low. However, in the case where a sudden temperature change, a sudden voltage change, or the like occurs, there is the possibility that the delay amount exceeds the control range. When such erroneous operation occurs, it is therefore important to detect the erroneous operation and take a proper countermeasure against the erroneous operation.

Such a situation similarly occurs in a digital DLL circuit having a delay line.

SUMMARY OF THE INVENTION

The present invention has been achieved to solve the problems and its object is to provide an information processing apparatus in which the user can properly and flexibly make settings for stabilizing the operation of a clock generating circuit early.

Another object of the present invention is to provide an information processing apparatus in which the user can properly and flexibly make settings for stabilizing the operation of a clock delaying circuit early from the outside of the clock delaying circuit.

According to the present invention, an information processing apparatus includes: a clock generating circuit generating an internal clock signal having a frequency which is the same as or is a multiple of the frequency of the reference clock signal by changing an oscillating cycle of a clock signal; and a control circuit setting a first initial value in the clock generating circuit on the basis of an instruction from the outside. The clock generating circuit includes a multiplication circuit, and the multiplication circuit includes: a first counter receiving the first initial value from the control circuit, adjusting a first count value to specify the oscillating cycle of the clock signal by using the first initial value as an initial count value, and outputting the first count value; and an oscillation circuit receiving the first count value from the first counter and oscillating the clock signal on the basis of the first count value.

According to the present invention, an information processing apparatus includes: a clock delay circuit delaying a first clock signal to synchronize the first clock signal with a second clock signal; and a control circuit setting an initial value in the clock delay circuit on the basis of an instruction from the outside. The clock delay circuit includes: a phase comparator comparing a phase of the first clock signal with a phase of the second clock signal; a counter receiving a phase comparison result and the initial value from the phase comparator and the control circuit, respectively, adjusting a count value to specify a delay amount of the first clock signal by using the initial value as an initial count value on the basis of the phase comparison result, and outputting the adjusted count value; and a variable delay circuit receiving the count value from the counter and delaying the first clock signal on the basis of the count value.

Since the information processing apparatus of the present invention allows the user to make settings on a clock generating circuit or a clock delaying circuit for stabilizing the operation of the clock generating circuit or clock delaying circuit at an early stage, setting can be effected appropriately and flexibly reflecting change in the operating status of the clock generating circuit or clock delaying circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
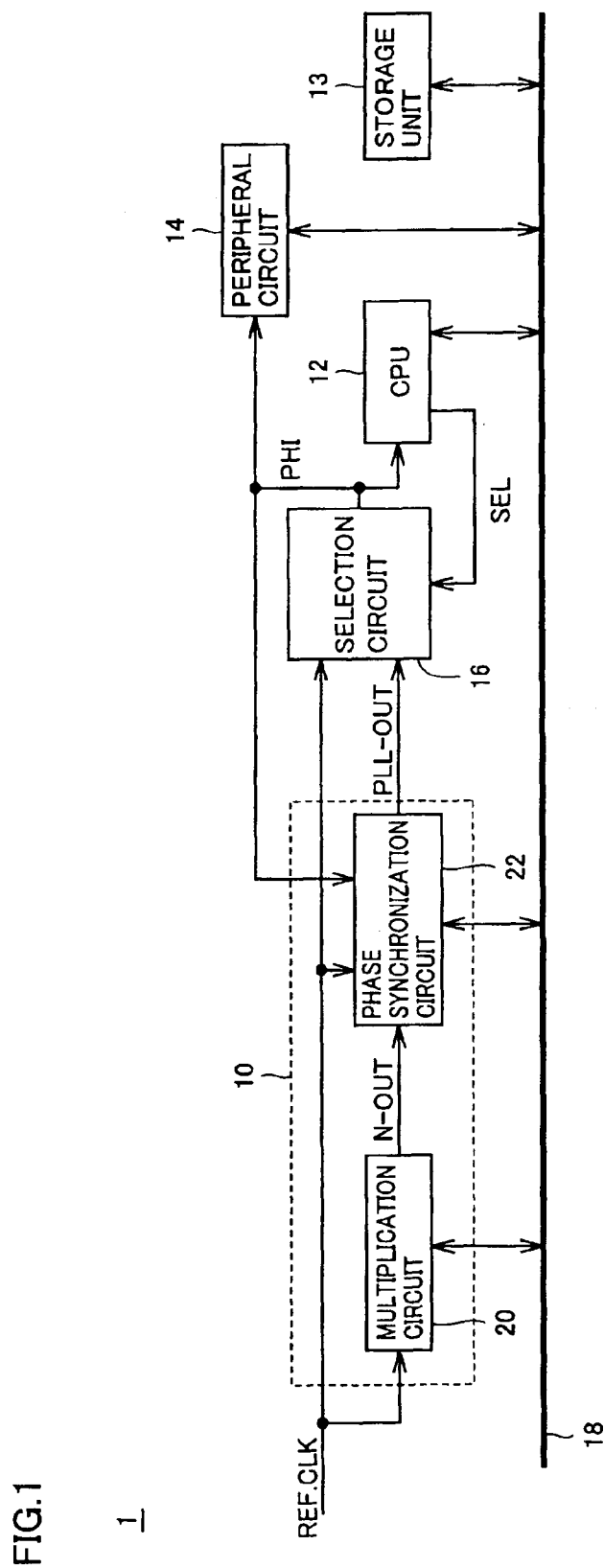
FIG. 1 is a functional block diagram for schematically describing the main part of an information processing apparatus according to a first embodiment of the present invention.

Embodiments of the present invention will now be described in detail below with reference to the drawings. The same or corresponding components are designated by the same reference numerals and their description will not be repeated.

First Embodiment

FIG. 1 is a functional block diagram for schematically describing the main part of an information processing apparatus according to a first embodiment of the present invention.

Referring to FIG. 1, an information processing apparatus 1 includes a digital PLL circuit 10, a CPU (Central Processing Unit) 12, a storage unit 13, a peripheral circuit 14, a selection circuit 16 and an internal bus 18. Digital PLL circuit 10 includes a multiplication circuit 20 and a phase synchronization circuit 22.

Multiplication circuit 20 receives a reference clock REF. CLK and generates a multiplied clock N-OUT of frequency obtained by multiplying the frequency of reference clock REF.CLK by four. Phase synchronization circuit 22 receives multiplied clock N-OUT, reference clock REF.CLK, and an output clock PHI supplied to peripheral circuit 14 and CPU 12, adjusts the phase of multiplied clock N-OUT so that output clock PHI is synchronized with reference clock REF.CLK, and outputs a PLL clock PLL-OUT.

Selecting circuit 16 receives a clock selection signal SEL from CPU 12 and, when clock selection signal SEL is at the H (logic high) level, outputs PLL clock PLL-OUT generated by digital PLL circuit 10 as output clock PHI to peripheral circuit 14 and CPU 12. When clock selection signal SEL is at the L (logic low) level, selection circuit 16 outputs reference clock REF.CLK as output clock PHI to peripheral circuit 14 and CPU 12.

Peripheral circuit 14 represents generically circuits in information processing apparatus 1 other than digital PLL circuit 10, selection circuit 16, CPU 12 and storage unit 13 shown in FIG. 1.

Storage unit 13 takes the form of a nonvolatile readable/writable storing device which is, for example, a flash memory. Storage unit 13 stores count values read from multiplication circuit 20 and phase synchronization circuit 22 by CPU 12. Storage unit 13 also stores an arithmetic expression of a count value calculated by CPU 12.

CPU 12 transmits/receives data to/from multiplication circuit 20, phase synchronization circuit 22, storage unit 13 and peripheral circuit 14 via internal bus 18. CPU 12 reads the count value from multiplication circuit 20 and phase synchronization circuit 22 via internal bus 18 at predetermined timings and writes the read count value into storage unit 13 via internal bus 18 as necessary. At the time of locking operation of digital PLL circuit 10, CPU 12 sets either the count value read from storage unit 13 via internal bus 18 or the count value calculated on the basis of the predetermined arithmetic expression read from storage unit 13 via internal bus 18 into multiplication circuit 20 and phase synchronization circuit 22 via internal bus 18. The CPU operation timing and the predetermined arithmetic expression will be described later when specific operation of each component will be described.

When the system is activated, CPU 12 outputs L-level clock selection signal SEL to selection circuit 16. When the operation of digital PLL circuit 10 is stabilized or locked, CPU 12 sets clock selection signal SEL to the H level.

Internal bus 18 is connected to CPU 12, storage unit 13, peripheral circuit 14, multiplication circuit 20 and phase synchronization circuit 22 and transmits data which is transmitted/received among the circuits.

Figure 2:
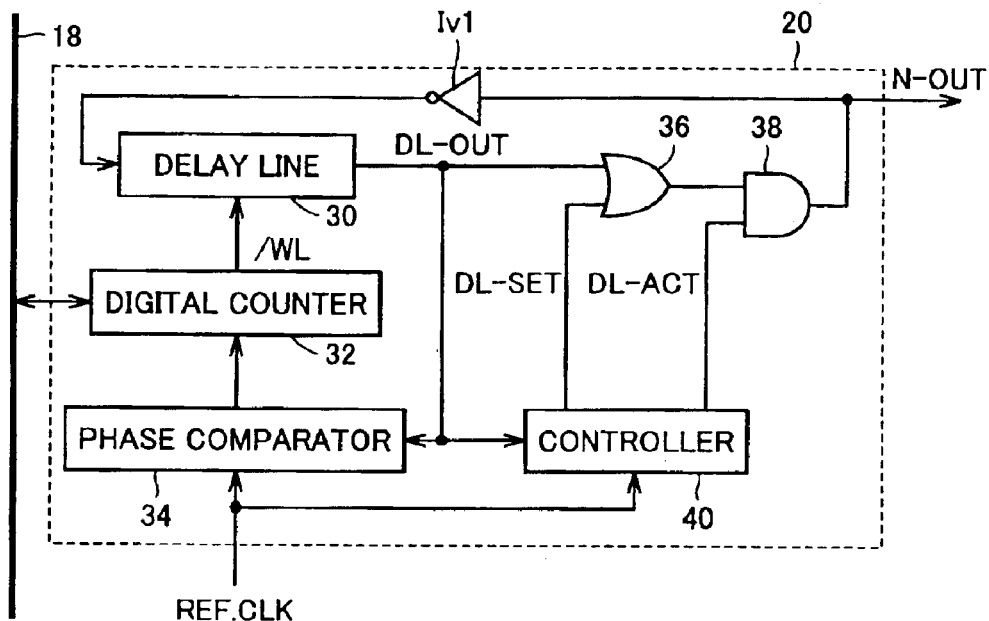
FIG. 2 is a functional block diagram for describing the function of a multiplication circuit shown in FIG. 1.

FIG. 2 is a functional block diagram for describing the function of multiplication circuit 20 shown in FIG. 1.

Referring to FIG. 2, multiplication circuit 20 includes a delay line 30, a digital counter 32, a phase comparator 34, an OR gate 36, an AND gate 38, an inverter Iv1 and a controller 40.

Delay line 30 receives an output signal from inverter Iv1, delays the signal only by delay time specified by a delay signal /WL received from digital counter 32 and outputs a delay clock DL-OUT. OR gate 36 computes OR of delay clock DL-OUT and a signal DL-SET outputted from controller 40. AND gate 38 computes AND of an output signal from OR gate 36 and a signal DL-ACT outputted from controller 40 and outputs the result of computation as multiplied clock N-OUT. Inverter Iv1 outputs a signal obtained by inverting multiplied clock N-OUT to delay line 30.

Delay line 30, OR gate 36, AND gate 38 and inverter Iv1 construct a ring oscillator. Specifically, during a signal passes through a loop constructed by delay line 30, OR gate 36, AND gate 38 and inverter Iv1, a negative feedback loop is constructed so that the logic level of the signal is inverted. With the configuration, the ring oscillator oscillates in a cycle which is twice as long as delay time of delay line 30.

Digital counter 32 increments or decrements the count value in accordance with a comparison result of phase comparator 34 and outputs delay signal /WL specifying delay time of delay line 30 to delay line 30. Digital counter 32 is connected to internal bus 18, outputs the count value to internal bus 18 in accordance with an instruction from CPU 12 which is not shown, and internally sets a count value received from CPU 12 via internal bus 18.

Phase comparator 34 compares the phase of delay clock DL-OUT with the phase of reference clock REF.CLK. If the phase of delay clock DL-OUT advances, phase comparator 34 outputs a count value increment instruction to digital counter 32. On the other hand, if the phase of delay clock DL-OUT delays, phase comparator 34 outputs a count value decrement instruction to digital counter 32.

When reference clock REF.CLK goes high, controller 40 sets both signals DL-ACT and DL-SET to the H level. Controller 40 sets signal DL-SET to the L level at the falling edge of reference clock REF.CLK and sets signal DL-ACT to the L level at the falling edge of the fourth pulse of delay clock DL-OUT (when the multiple ratio is 4). That is, signal DL-SET goes high synchronously with the rising edge of reference clock REF.CLK and the ring oscillator is initialized at that timing. When signal DL-ACT goes low, oscillation of the ring oscillator is stopped.

Figure 3:
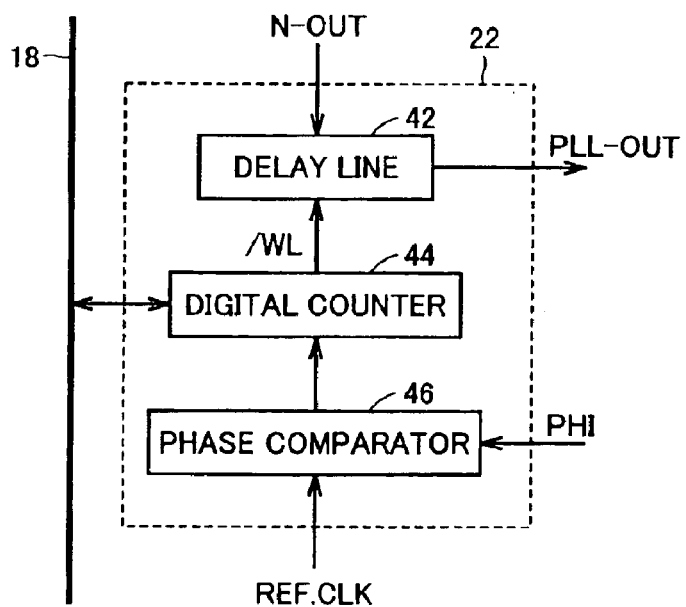
FIG. 3 is a functional block diagram for describing the function of a phase synchronization circuit shown in FIG. 1.

FIG. 3 is a functional block diagram for describing the function of phase synchronization circuit 22 shown in FIG. 1.

Referring to FIG. 3, phase synchronization circuit 22 includes a delay line 42, a digital counter 44 and a phase comparator 46. Delay line 42 receives multiplied clock N-OUT from multiplication circuit 20, delays multiplied clock N-OUT only by delay time specified by delay signal /WL received from digital counter 44, and outputs PLL clock PLL-OUT.

Digital counter 44 increases/decreases the count value in accordance with a result of comparison of phase comparator 46 and outputs delay signal /WL specifying delay time of delay line 42 to delay line 42. Digital counter 44 is connected to internal bus 18, outputs the count value to internal bus 18 in accordance with an instruction from CPU 12 which is not shown, and internally sets the count value received from CPU 12 via internal bus 18.

Phase comparator 46 compares the phase of output clock PHI with the phase of reference clock REF.CLK. If the phase of output clock PHI advances, phase comparator 46 outputs a count value increment instruction to digital counter 44. On the other hand, if the phase delays, phase comparator 46 outputs a count value decrement instruction to digital counter 44.

Figure 4:
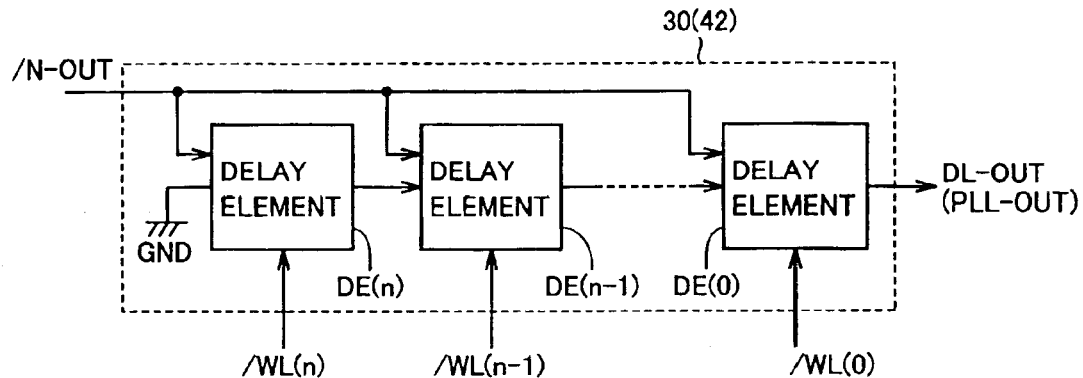
FIG. 4 is a circuit diagram showing the configuration of a delay line shown in FIGS. 2 and 3.

FIG. 4 is a circuit diagram showing the configuration of delay lines 30 and 42 shown in FIGS. 2 and 3.

Referring to FIG. 4, delay line 30 (42) is constructed by delay elements DE(0) to DE(n) of n stages (n: natural number of 2 or larger) which are connected in series. Each delay element DE(i) outputs an inversion clock /N-OUT of multiplied clock N-OUT to delay element DE(i−1) in the following stage when a delay signal /WL(i) received from digital counter 32 (44) which is not shown is at the L level, and outputs a signal received from delay element DE(i+1) in the preceding stage to delay element DE(i−1) in the following stage when delay signal /WL(i) is at the H level. In delay element DE(n) in the first stage, an L-level signal always corresponds to a signal received from the delay element in the preceding stage.

On the basis of the count value, digital counter 32 (44) sets one of delay signals /WL(0) to /WL(n) to the L level and outputs the resultant signal. Only in delay element DE(i) which receives L-level delay signal /WL(i), inversion clock /N-OUT is outputted to delay element DE(i−1) in the following stage and transmitted to the subsequent delay elements. That is, inversion clock /N-OUT is taken in delay line 30 (42) from delay element DE(i) which has received L-level delay signal /WL(i). Consequently, by changing the position of receiving inversion clock /N-OUT in accordance with delay signals /WL(0) to /WL(n), the delay amount of delay line 30 (42) is adjusted.

Figure 5:
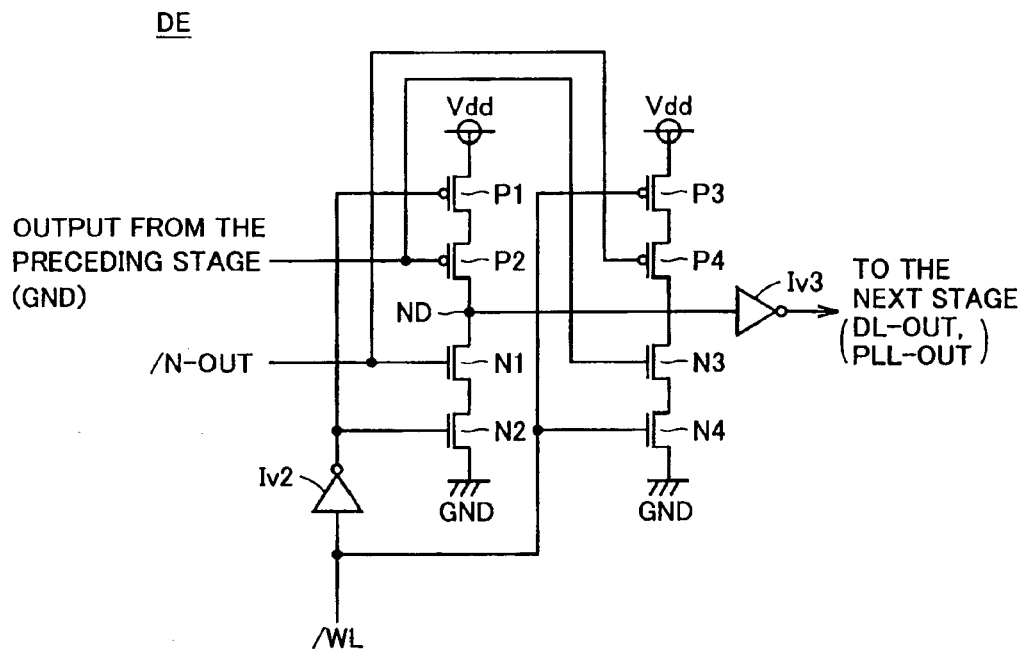
FIG. 5 is a circuit diagram showing the configuration of a delay element shown in FIG. 4.

FIG. 5 is a circuit diagram showing the configuration of delay element DE shown in FIG. 4.

Referring to FIG. 5, delay element DE includes P-channel MOS transistors P1 to P4, N-channel MOS transistors N1 to N4, inverters Iv2 and Iv3, a power source node Vdd, a ground node GND and a node ND.

P-channel MOS transistor P1 is connected between power source node Vdd and P-channel MOS transistor P2 and receives an output signal from inverter Iv2 by its gate. P-channel MOS transistor P2 is connected between P-channel MOS transistor P1 and node ND and receives an output signal from delay element DE in the preceding stage by its gate. N-channel MOS transistor N1 is connected between node ND and N-channel MOS transistor N2 and receives inversion clock /N-OUT of multiplied clock N-OUT by its gate. N-channel MOS transistor N2 is connected between N-channel MOS transistor N1 and ground node GND and receives an output signal from inverter Iv2 by its gate. Inverter Iv2 outputs a signal obtained by inverting delay signal /WL.

P-channel MOS transistor P3 is connected between power source node Vdd and P-channel MOS transistor P4 and receives delay signal /WL by its gate. P-channel MOS transistor P4 is connected between P-channel MOS transistor P3 and node ND and receives inversion clock /N-OUT by its gate. N-channel MOS transistor N3 is connected between node ND and N-channel MOS transistor N4 and receives an output signal from delay element DE in the preceding stage by its gate. N-channel MOS transistor N4 is connected between N-channel MOS transistor N3 and ground node GND and receives delay signal /WL by its gate. Inverter Iv3 outputs a signal obtained by inverting a signal on node ND.

When delay signal /WL is at the L level, delay element DE delays inversion clock /N-OUT by the inverters in two stages and outputs the delayed signal. On the other hand, when delay signal /WL is at the H level, delay element DE delays an output signal from the delay element in the preceding stage by the inverters in two stages and outputs the delayed signal.

Figure 6:
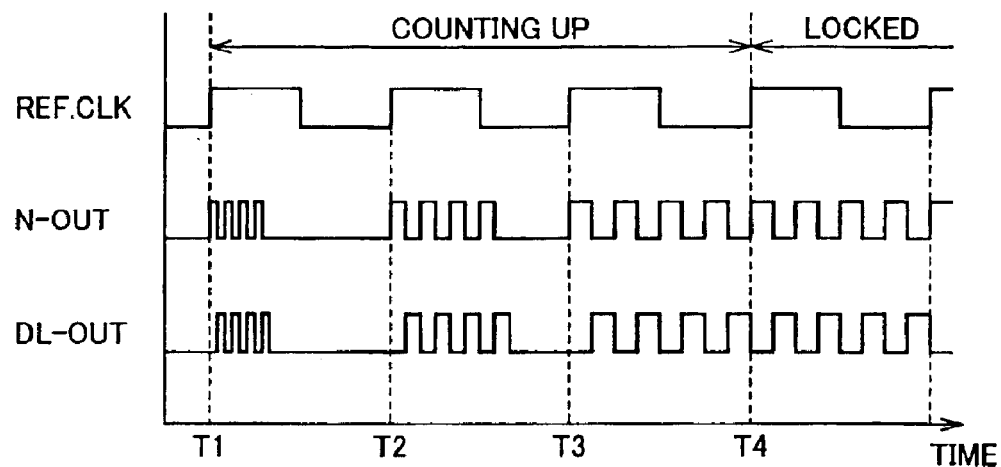
FIG. 6 is an operational waveform chart for describing the operation of the multiplication circuit in the case where a count value is not set by a CPU.
Figure 7:
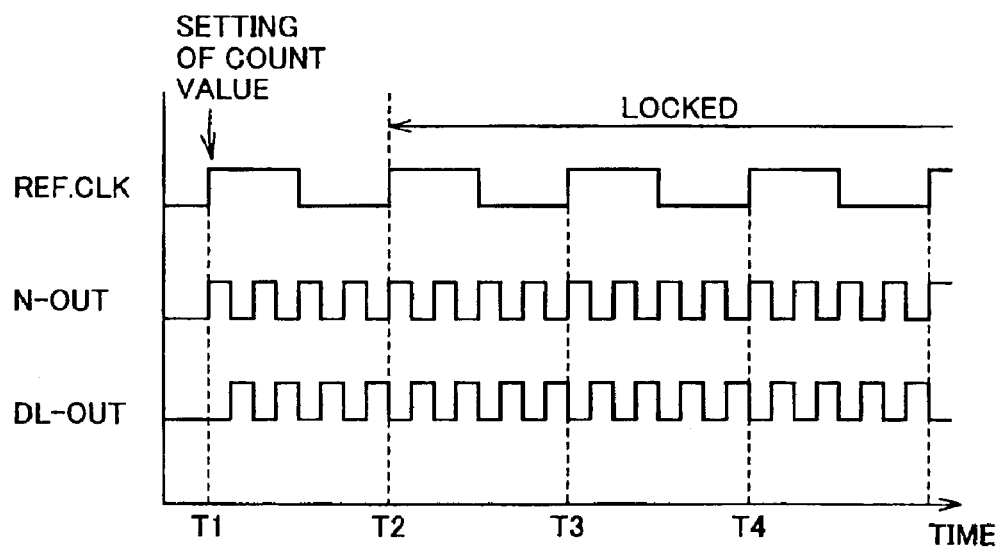
FIG. 7 is an operational waveform chart for describing the operation of the multiplication circuit in the case where a count value is set by the CPU.

FIGS. 6 and 7 are operation waveform charts for describing the operation of multiplication circuit 20 and show operation waveforms immediately after the system is activated. FIG. 6 is an operation waveform chart showing a case where a count value is not set by CPU 12 for comparison and FIG. 7 is an operation waveform chart showing a case where the count value is set by CPU 12.

First, referring to FIG. 6, before time T1, multiplication circuit 20 is in an initial state and the count value of digital counter 32 is 0. At time T1, when reference clock REF.CLK goes high, the ring oscillator oscillates and delay clock DL-OUT and multiplied clock N-OUT are output. Since the count value is 0, delay time of the delay line is the minimum and the oscillation cycle is the minimum.

Phase comparator 34 compares the falling timing of the fourth pulse of delay clock DL-OUT with the rising timing of reference clock REF.CLK at time T2. Since the phase of delay clock DL-OUT advances, phase comparator 34 outputs a count value increment instruction to digital counter 32.

When reference clock REF.CLK goes high at time T2, the ring oscillator oscillates again and delay clock DL-OUT and multiplied clock N-OUT each having a cycle longer than that of last time are output. However, the phase of delay clock DL-OUT still advances, so that phase comparator 34 outputs a count value increment instruction to digital counter 32.

When reference clock REF.CLK goes high at time T3, the ring oscillator oscillates again and delay clock DL-OUT and multiplied clock N-OUT each having a cycle which is further longer than that of last time are output.

When the falling edge of the fourth pulse of delay clock DL-OUT coincides with the rising edge of reference clock REF.CLK at time T4, multiplication circuit 20 is locked and digital counter 32 stops incrementing its count value. At this time, the frequency of multiplied clock N-OUT is just four times as high as that of reference clock REF.CLK.

Referring to FIG. 7, at time T1 immediately after activation of the system, for example, when the count value immediately before the system is stopped is set by CPU 12, multiplied clock N-OUT with an almost desired frequency is outputted from time T1.

At time T2, the falling edge of the fourth pulse of delay clock DL-OUT coincides with the rising edge of reference clock REF.CLK and multiplication circuit 20 enters a locked state early.

Figure 8:
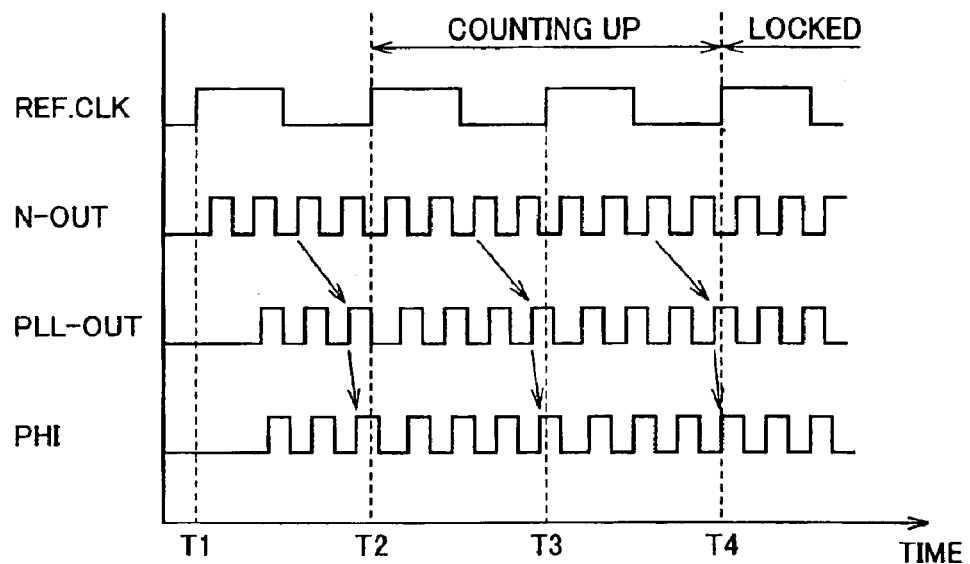
FIG. 8 is an operational waveform chart for describing the operation of the phase synchronization circuit in the case where the count value is not set by the CPU.
Figure 9:
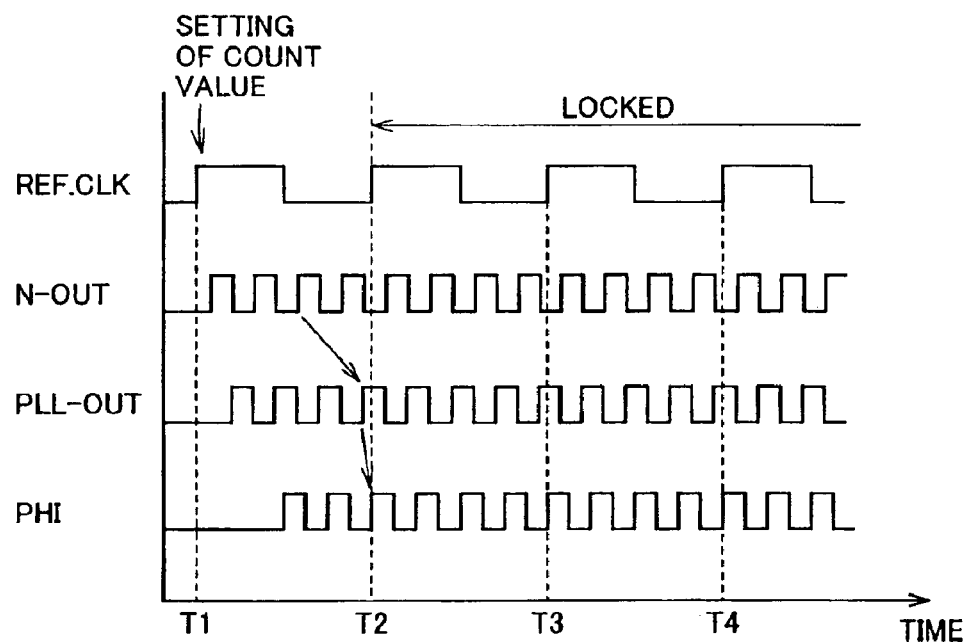
FIG. 9 is an operational waveform chart for describing the operation of the phase synchronization circuit in the case where the count value is set by the CPU.

FIGS. 8 and 9 are operation waveform charts for describing the operation of phase synchronization circuit 22. FIGS. 8 and 9 also show operation waveforms immediately after activation of the system. FIG. 8 is an operation waveform chart showing a case where the count value is not set by CPU 12 for comparison. FIG. 9 is an operation waveform chart of a case where the count value is set by CPU 12.

First, referring to FIG. 8, the pulses of clocks connected by arrows correspond to the same pulse generated by multiplication circuit 20. With respect to multiplied clock N-OUT, the signal waveform after time T1 at which multiplied clock N-OUT starts to be outputted at a predetermined frequency is shown. With respect to PLL clock PLL-OUT and output clock PHI, the signal waveforms corresponding to multiplied clock N-OUT are shown.

At time T2, phase comparator 46 compares the phase of output clock PHI with the phase of reference clock REF.CLK. Since the phase of output clock PHI advances, phase comparator 46 outputs a count value increment instruction to digital counter 44. Also at time T3, the phase of output clock PHI advances with respect to the phase of reference clock REF.CLK, so that phase comparator 46 further outputs a count value increment instruction to digital counter 44.

At time T4, when the phase of output clock PHI and the phase of reference clock REF.CLK coincide with each other, phase synchronization circuit 22 is locked and digital counter 44 stops incrementing the count value.

On the other hand, referring to FIG. 9, the state of phase synchronization circuit 22 at time T1 corresponds to the state at time T1 in FIG. 8. When the count value immediately before stop of the system is set by the CPU 12 at time T1, PLL clock PLL-OUT is outputted in phase delayed almost as desired from the beginning of output. At time T2, the phase of output clock PHI coincides with the phase of reference clock REF.CLK and phase synchronization circuit 22 is locked early.

In the case where the operation specifications of information processing apparatus 1 on which digital PLL circuit 10 is mounted are fixed and the count value of the digital counter which is preliminarily locked is known more or less, the count value is stored in storage unit 13 and, after activation or resetting of the system, CPU 12 may read the count value from storage unit 13 and set the count value in multiplication circuit 20 and phase synchronization circuit 22 via internal bus 18.

With the configuration, lock time at the time of system activation or reset can be shortened. Particularly, in a system which is frequently reset, process performance is improved and power consumed in the locking operation can be also reduced.

Figure 10:
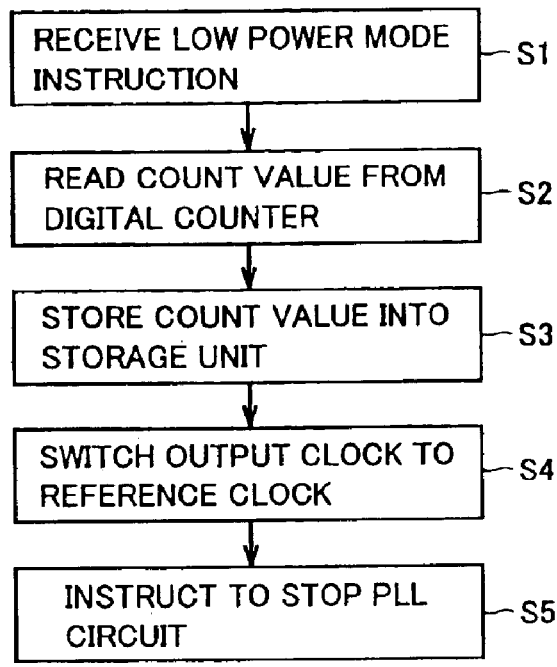
FIG. 10 is a flowchart of the case where the information processing apparatus shifts to a low power mode.
Figure 11:
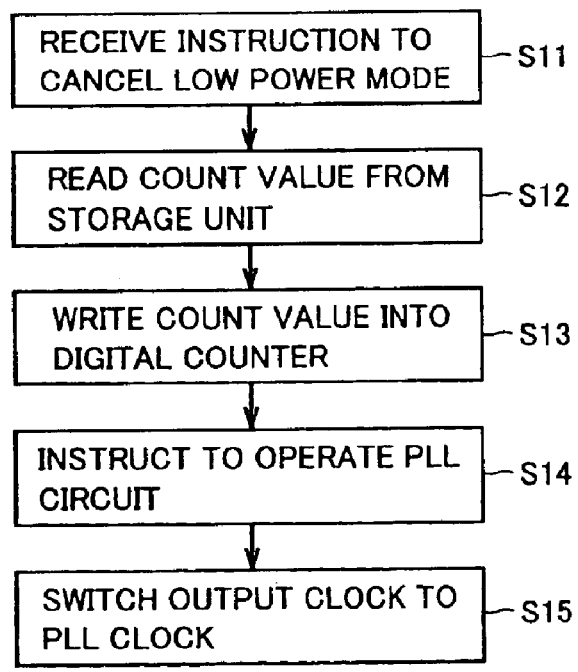
FIG. 11 is a flowchart of the case where the information processing apparatus returns from the low power mode.

FIGS. 10 and 11 are flowcharts of a case where information processing apparatus 1 enters a low power mode and digital PLL circuit 10 is stopped. FIG. 10 is a flowchart showing a case where information processing apparatus 1 shifts to the low power mode, and FIG. 11 is a flowchart showing a case where information processing apparatus 1 returns from the low power mode.

Referring to FIG. 10, when the low power mode is instructed in information processing apparatus 1 (step S1), CPU 12 reads the count values from digital counters 32 and 44 of multiplication circuit 20 and phase synchronization circuit 22, respectively, via internal bus 18 (step S2). CPU 12 writes the read count value into storage unit 13 via internal bus 18 (step S3).

Subsequently, CPU 12 outputs clock selection signal SEL of the L level to be outputted to selection circuit 16 and, in response to the signal, selection circuit 16 outputs reference clock REF.CLK as output clock PHI (step S4). CPU 12 outputs an operation stop instruction to digital PLL circuit 10 (step S5).

Referring to FIG. 11, when cancellation of the low power mode is instructed (step S11), CPU 12 reads the count value stored in storage unit 13 at the shift to the low power mode from storage unit 13 via internal bus 18 (step S12). CPU 12 writes the read count value into digital counters 32 and 44 of multiplication circuit 20 and phase synchronization circuit 22, respectively, via internal bus 18 (step S13).

Subsequently, CPU 12 outputs an operation start instruction to digital PLL circuit 10 (step S14). CPU 12 sets clock selection signal SEL to be outputted to selection circuit 16 to the H level and selection circuit 16 outputs PLL clock PLL-OUT as output clock PHI (step S15).

As described above, in the case where digital PLL circuit 10 is temporarily stopped in the low power mode and operates again, the lock time is shortened. Consequently, the speed of returning operation from the low power mode increases and power necessary for the returning operation can be also reduced.

Figure 12:
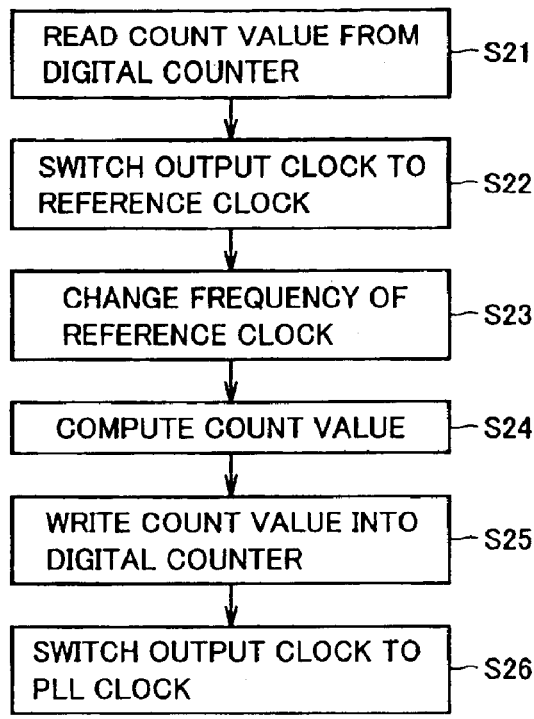
FIG. 12 is a flowchart of the case where the frequency of a reference clock is changed.

FIG. 12 is a flowchart of a case where the frequency of reference clock REF.CLK is changed.

Referring to FIG. 12, before the frequency of reference clock REF.CLK is changed, CPU 12 reads out the count value from digital counter 32 of multiplication circuit 20 via internal bus 18 (step S21). CPU 12 outputs clock selection signal SEL at the L level to be outputted to selection circuit 16 and, in response to it, selection circuit 16 outputs reference clock REF.CLK as output clock PHI (step S22).

In response to changing the frequency of reference clock REF.CLK (step S23), CPU 12 reads out an arithmetic expression for calculating the count value after the frequency change from storage unit 13 via internal bus 18 and calculates the count value after frequency change by using the arithmetic expression (step S24). The arithmetic expression is the following expression (1).

$$x1 = t \times i/\Delta d - t/\Delta d + i \times a \quad (1)$$

where "x1" denotes the count value after the change in frequency, "t" denotes a half cycle of multiplied clock N-OUT when the count value is 0, "i" denotes the ratio between the cycle after the change in frequency and the cycle before the change in frequency, "Δd" indicates an increased amount of delay time in the delay line of the digital counter when the count value is incremented by one, and "a" expresses the count value before the change in frequency read from digital counter 32.

The expression (1) is led as follows. Cycles Ta and Tb of multiplied clock N-OUT before and after the change in frequency are expressed by the following equations (2) and (3), respectively.

$$Ta = 2(t + a\Delta d) \quad (2)$$

$$Tb = 2(t + x1\Delta d) \quad (3)$$

where i=Tb/Ta. Consequently, the expression (1) is derived.

The expression (1) can be programmed by the user of information processing apparatus 1. The user therefore can adjust a constant and an expression itself in an actual use state, so that flexible and high-precision setting of the count value is realized.

CPU 12 calculates the count value in step S24 and writes the calculated count value into digital counter 32 of multiplication circuit 20 via internal bus 18 (step S25). CPU 12 sets clock selection signal SEL to be outputted to selection circuit 16 to the H level and, in response to it, selection circuit 16 outputs PLL-clock PLL-OUT as output clock PHI (step S26).

Without performing a strict arithmetic operation as described above, in the case where, for example, the frequency is changed to ½, CPU 12 may double the count value before change and set the doubled count value into digital counter 32 in multiplication circuit 20.

Also in the case where the frequency of reference clock REF.CLK is changed as described above, the lock time is shortened, so that change in reference clock REF.CLK is completed in short time and power required for the frequency changing operation is also reduced.

Figure 13:
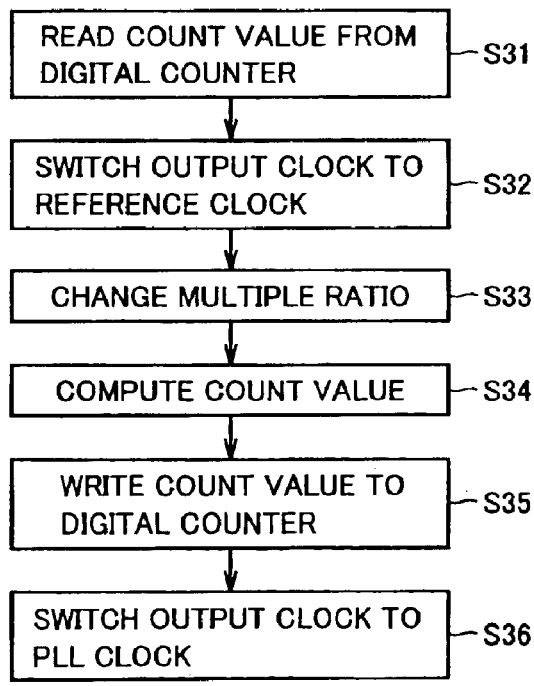
FIG. 13 is a flowchart showing the case where a multiple ratio is changed.

FIG. 13 is a flowchart of a case where the multiple ratio is changed.

Referring to FIG. 13, before the multiple ratio is changed, CPU 12 reads out the count value from digital counter 32 of multiplication circuit 20 via internal bus 18 (step S31). CPU 12 outputs clock selection signal SEL at the L level which is to be outputted to selection circuit 16 and, in response to it, selection circuit 16 outputs reference clock REF.CLK as output clock PHI (step S32).

CPU 12 changes the multiple ratio (step S33), reads out an arithmetic expression for calculating the count value after the change in the multiple ratio from storage unit 13 via internal bus 18 and calculates the count value after the change in the multiple ratio by using the arithmetic expression (step S34). The arithmetic expression is the following equation (4).

$$x2=t/(j\Delta d)-t/\Delta d+a/j \quad (4)$$

where "x2" denotes the count value after the change in the multiple ratio, "j" indicates the ratio between the multiple ratio after the change in frequency and the multiple ratio before the change in frequency, and "a" denotes the count value before the change in the multiple ratio read from digital counter 32.

The expression (4) is derived as follows. Cycles Tc and Td of multiplied clock N-OUT before and after the change in the multiple ratio are expressed by the following equations (5) and (6), respectively.

$$Tc=2(t+a\Delta d) \quad (5)$$

$$Td=2(t+x2\Delta d) \quad (6)$$

Assuming now that the multiple ratio before change is n and the multiple ratio after change is N, there is the relation of j=N/n and Tc×n=Td×N (=the frequency of reference clock REF.CLK), the expression (4) is derived.

The expression (4) can be also programmed by the user of information processing apparatus 1 in a manner similar to the expression (1).

CPU 12 calculates the count value in step S34 and writes the calculated count value into digital counter 32 of multiplication circuit 20 via internal bus 18 (step S35). CPU 12 sets clock selection signal SEL outputted to selection circuit 16 to the H level and, in response to it, selection circuit 16 outputs PLL-clock PLL-OUT as output clock PHI (step S36).

Without performing a strict arithmetic operation as described above, in the case where, for example, the multiple ratio is changed to ½, CPU 12 may double the count value before change and sets the doubled count value into digital counter 32 in multiplication circuit 20.

Also in the case where the multiple ratio is changed as described above, the lock time is shortened, so that change in reference clock REF.CLK is completed in short time and power required for the multiple changing operation is also reduced.

In the above description, digital PLL circuit 10 serves as a clock generating circuit and CPU 2 serves as a control circuit.

Figure 20:
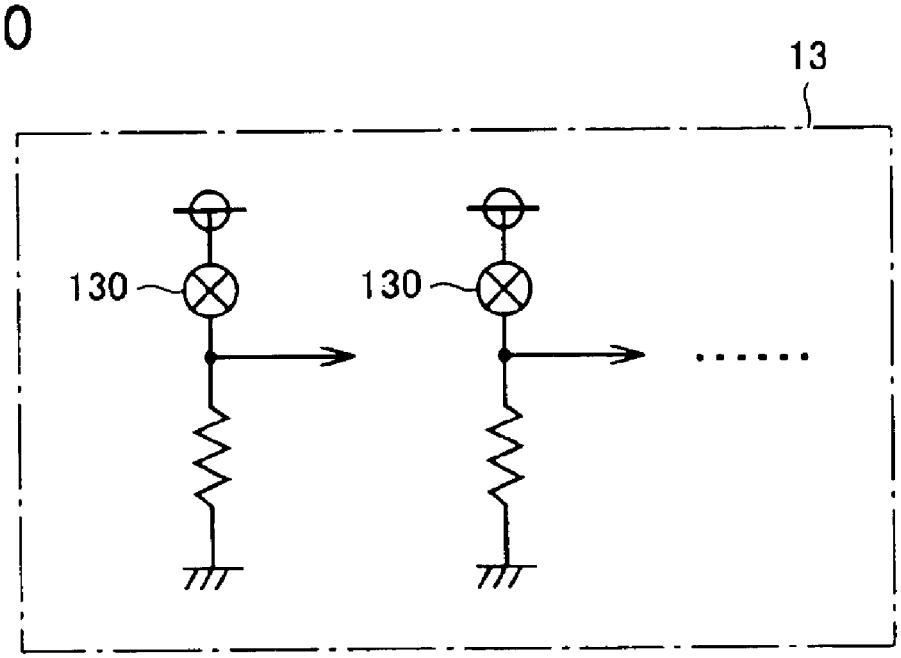
FIG. 20 is a circuit diagram showing a configuration of a fuse circuit.

Although it has been described that storage unit 13 takes the form of a nonvolatile readable/writable storing device which is, for example, a flash memory, when information processing apparatus 1 is used under predetermined conditions of the frequency of the reference clock and the multiple ratio, the count value becomes an almost stable constant value. Therefore, it is possible to construct storage unit 13 by a fuse circuit, as shown in FIG. 20. and store the count value by laser-trimming the fuse circuit.

Although digital PLL circuit 10 generates PLL clock PLL-OUT having the frequency four times as high as that of reference clock REF.CLK in the above description, the multiple ratio is not limited to 4 but may be smaller or larger than 4.

As described above, in information processing apparatus 1 of the first embodiment, the count value of the digital counter in digital PLL circuit 10 can properly set by CPU 12 on the basis of the instruction from the user, so that proper setting can be made flexibly in accordance with a change in the operation state of digital PLL circuit 10. As a result, the operation of digital PLL circuit 10 can be stabilized early.

Second Embodiment

Figure 14:
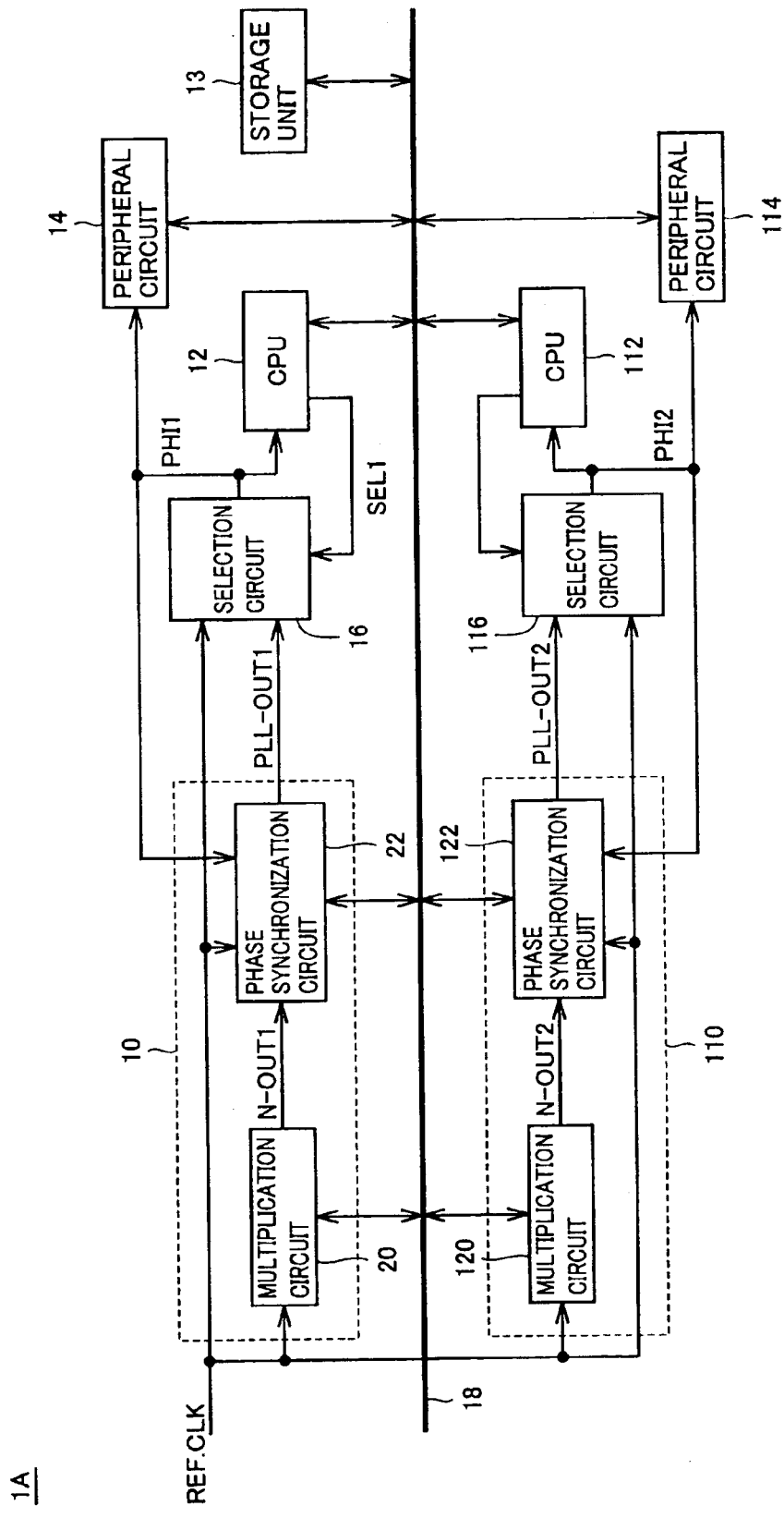
FIG. 14 is a functional block diagram for schematically describing the main part of an information processing apparatus according to a second embodiment of the present invention.

FIG. 14 is a functional block diagram for schematically describing the main part of an information processing apparatus according to a second embodiment of the present invention.

Referring to FIG. 14, an information processing apparatus 1A includes the components of information processing apparatus 1 according to the first embodiment and, in addition, a digital PLL circuit 110, a CPU 112, a peripheral circuit 114 and a selection circuit 116. Digital PLL circuit 110 includes a multiplication circuit 120 and a phase synchronization circuit 122.

Information processing apparatus 1A is a multi-processor system on which two CPUs are mounted and has independent digital PLL circuits 10 and 110 corresponding to CPUs 12 and 112, respectively. CPU 112, selection circuit 116, multiplication circuit 120 and phase synchronization circuit 122 are provided in correspondence with CPU 12, selection circuit 16, multiplication circuit 20 and phase synchronization circuit 22, respectively, and their circuit configurations are the same. Multiplication circuit 120, phase synchronization circuit 122, CPU 112 and peripheral circuit 114 are connected to common internal bus 18 together with multiplication circuit 20, phase synchronization circuit 22, CPU 12, peripheral circuit 14 and storage unit 13 so that data can be transmitted/received from each other.

Digital PLL circuits 10 and 110 are formed on the same silicon substrate and manufactured by the same manufacturing process. Therefore, the circuit characteristics of circuits 10 and 110 almost coincide with each other. When setting of the multiple ratio is the same in circuits 10 and 110, the count values in circuits become almost the same value.

In information processing apparatus 1A according to the second embodiment, the count value of the digital PLL circuit on the side of one of the CPUs can be read by the other CPU and the count value can be set in the digital PLL circuit on the side of one of the CPUs by the other CPU. For example, in the case where CPUs 12 and 112 operate at different operation frequencies and the operation frequency of CPU 112 is changed to the operation frequency of CPU 12, CPU 12 reads out the count value of digital PLL circuit 10 and sets the read count value into digital PLL circuit 110.

In the case where digital PLL circuit 10 is operating and digital PLL circuit 110 which has been stopped starts operating, CPU 12 reads out the count value of digital PLL circuit 10 and sets the read count value into digital PLL circuit 110.

Alternately, CPU 112 may read the count value of digital PLL circuit 10 and set the read count value into PLL circuit 110.

As described above, in information processing apparatus 1A according to the second embodiment, the count value of the digital counter in one of the digital PLL circuits can be set as the count value of the digital counter in the other digital PLL circuit. Consequently, when the operating condition of the digital PLL circuit is changed, lock time is shortened, so that the processing performance is improved and power consumption required for the locking operation is reduced.

Third Embodiment

In an information processing apparatus according to a third embodiment, overflow or underflow of the count value of the digital counter in the digital PLL circuit is detected and a proper countermeasure to avoid an abnormal state is taken.

Figure 15:
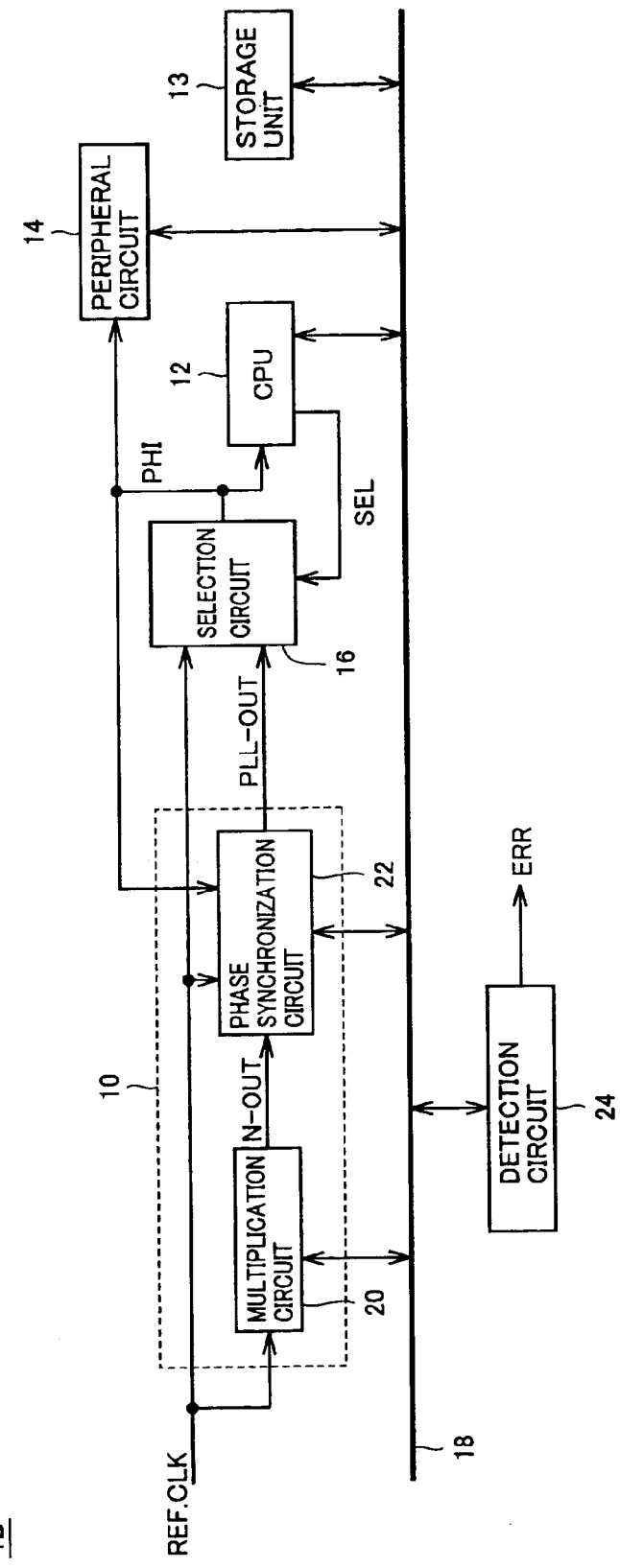
FIG. 15 is a functional block diagram for schematically describing the main part of an information processing apparatus according to a third embodiment of the present invention.

FIG. 15 is a functional block diagram for schematically describing the main part of the information processing apparatus according to the third embodiment of the present invention.

Referring to FIG. 15, an information processing apparatus 1B according to the third embodiment has, in addition to the components of information processing apparatus 1 of the first embodiment, a detection circuit 24. Detection circuit 24 is connected to internal bus 18, receives the count value of digital counter 32 in multiplication circuit 20 and the count value of digital counter 44 in phase synchronization circuit 22 in a real time manner via internal bus 18 and always monitors the count value. When detection circuit 24 detects that the count value overflows or underflows, detection circuit 24 outputs an interrupt signal to CPU 12 via internal bus 18 and outputs an error signal ERR to an external terminal which is not shown.

When the interrupt signal is received from detection circuit 24, CPU 12 can take various countermeasures. For example, CPU 12 sets clock selection signal SEL to the L level in accordance with the interrupt signal so that output clock PHI can be switched from PLL clock PLL-OUT to reference clock REF.CLK. CPU 12 can also change the multiple ratio so that the overflow or underflow of the count value is resolved. Specifically, at the time of overflow, the multiple ratio is increased. At the time of underflow, the multiple ratio is decreased.

Further, CPU 12 controls an internal power source generating apparatus and an external power source apparatus to stabilize or change the voltage, thereby obtaining a normal state. Furthermore, when a cooling apparatus is provided on the outside of information processing apparatus 1B, CPU 12 can obtain a normal state by controlling the cooling apparatus to reset the temperature to be within a normal range. Further, CPU 12 can also obtain a normal state by stopping a part of the peripheral circuit to control power consumption.

Various countermeasures taken by CPU 12 are carried out in accordance with a program set by the user. Specifically, the user of information processing apparatus 1B preliminarily generates programs corresponding to the various countermeasures taken by CPU 12 and stores the programs in storage unit 13. Therefore, the user can take various countermeasures against various failures which occur in actual use, so that the system having high flexibility is realized.

Figure 16:
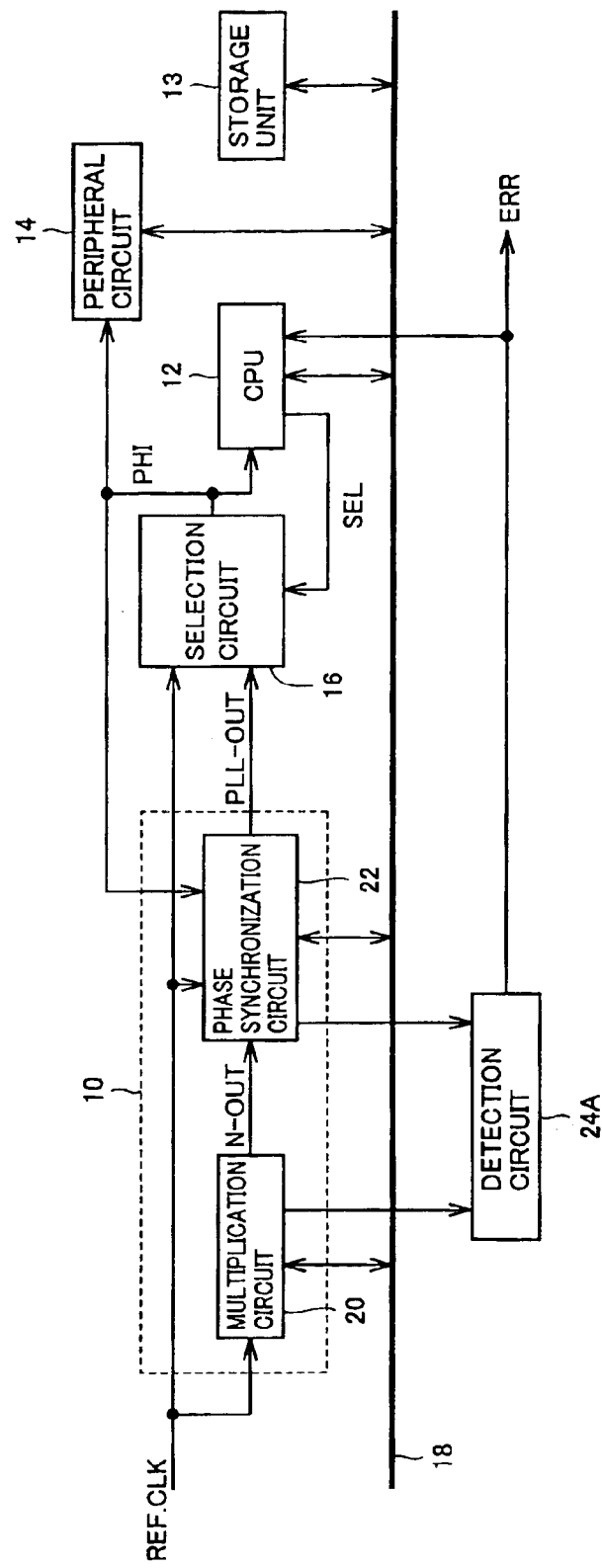
FIG. 16 is a diagram showing a modification of the information processing apparatus shown in FIG. 15.

FIG. 16 is a diagram showing a modification of the information processing apparatus of FIG. 15.

Referring to FIG. 16, an information processing apparatus 1C includes the same components as those of information processing apparatus 1B except that the apparatus includes a detection circuit 24A in place of detection circuit 24. Detection circuit 24A is connected directly to multiplication circuit 20, phase synchronization circuit 22 and CPU 12. The functions of detection circuit 24A are the same as those of detection circuit 24 in information processing apparatus 1B.

Each of information processing apparatuses 1B and 1C has a dedicated detection circuit for detecting overflow and underflow of the count value of the digital counter by monitoring the count value. Another configuration may be used such that the detection circuit is not provided, and CPU 12 takes in the count value in a real-time manner via internal bus 18, always monitors the count value, and detects overflow and underflow of the count value.

As described above, in each of information processing apparatuses 1B and 1C according to the third embodiment, the detection circuit detects overflow or underflow of the digital counter in digital PLL circuit 10 and, when overflow or underflow is detected, CPU 12 takes a countermeasure to avoid the abnormal state on the basis of an instruction from the user. Thus, erroneous operation of digital PLL circuit 10 is prevented.

When overflow or underflow occurs, such an abnormal state is notified also to the outside. Consequently, the user of information processing apparatuses 1B and 1C can detect the abnormal state of digital PLL circuit 10 and take a proper countermeasure.

Fourth Embodiment

In a fourth embodiment, the number of pulses of multiplied clock generated by the multiplication circuit is counted and a proper count value which is set in the digital counter is calculated from the number of pulses. With the configuration, even if there is no stored data of the count value before operation stop of the digital PLL circuit when the digital PLL circuit starts operating, a proper count value can be set in the digital counter.

Figure 17:
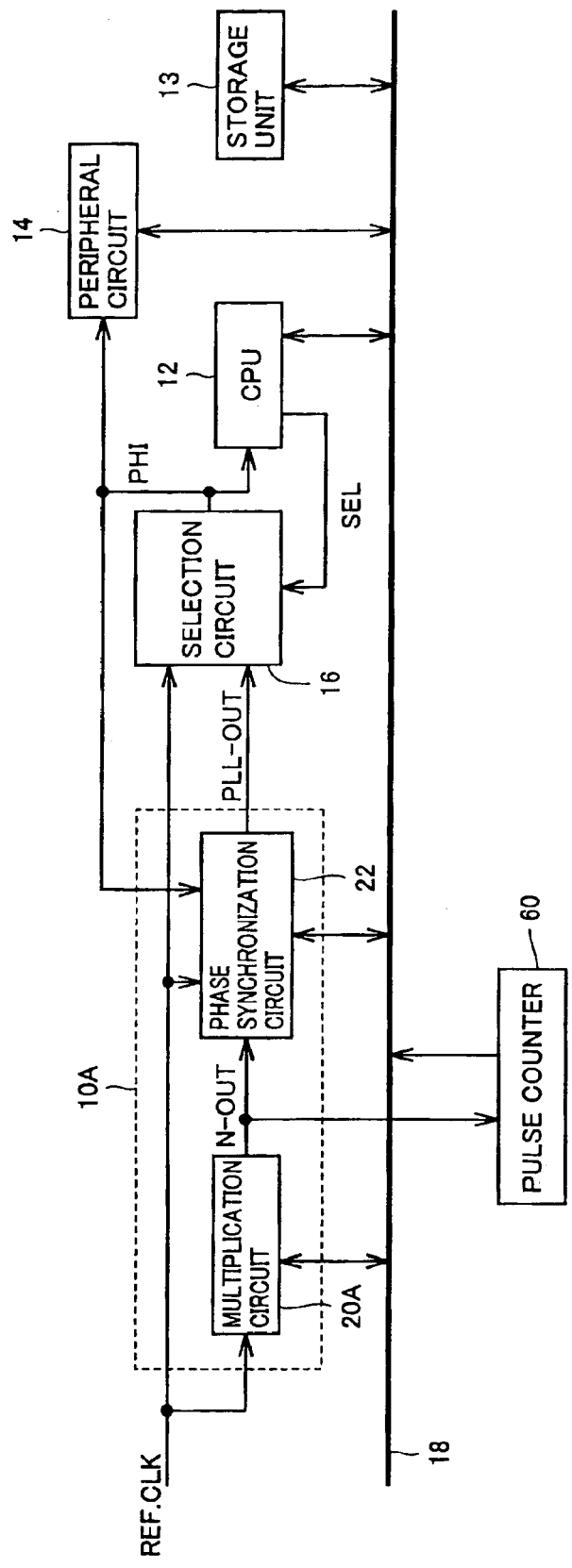
FIG. 17 is a functional block diagram for schematically describing the main part of an information processing apparatus according to a fourth embodiment of the present invention.

FIG. 17 is a functional block diagram for schematically describing the main part of an information processing apparatus according to the fourth embodiment.

Referring to FIG. 17, an information processing apparatus 1D has the components of information processing apparatus 1 according to the first embodiment and, in addition, a pulse counter 60. Information processing apparatus 1D has a multiplication circuit 20A in place of multiplication circuit 20.

Multiplication circuit 20A has the functions of multiplication circuit 20 in the first embodiment and, further, receives a counter fixing signal FIX from CPU 12 via internal bus 18, fixes the count value of the digital counter, oscillates, and outputs multiplied clock N-OUT.

Pulse counter 60 is connected to an output node of multiplication circuit 20A and internal bus 18. Pulse counter 60 receives multiplied clock N-OUT, counts the number of pulses, and outputs the pulse count value to CPU 12 via internal bus 18.

In information processing apparatus 1D, immediately after system activation or reset and before the digital PLL circuit starts operating, CPU 12 outputs counter fixing signal FIX at the H level to multiplication circuit 20A via internal bus 18. Pulse counter 60 receives multiplied clock N-OUT oscillated in a state where the count value is fixed in multiplication circuit 20A, and counts the number of pulses of multiplied clock N-OUT in a cycle of reference clock REF.CLK. Pulse counter 60 outputs the pulse count value to CPU 12 via internal bus 18.

CPU 12 receives the pulse count value, reads the following arithmetic expression (7) from storage unit 13 via internal bus 18, and calculates an initial count value which is set in the digital counter of multiplication circuit 20A by using the pulse count value. CPU 12 outputs the calculated initial count value to multiplication circuit 20A via internal bus 18 and sets counter fixing signal FIX which has been outputted at the H level to the L level.

The arithmetic expression (7) for computing the initial count value is as follows.

$$x3 = a/n \times c - a \tag{7}$$

$$a = t/\Delta d \tag{8}$$

where "x3" denotes an initial count value, "c" denotes the number of count pulses, "t" denotes a half cycle of multiplication clock N-OUT when the count value is 0, "$\Delta d$" indicates an increase amount in delay time in the delay line of the digital counter when the count value is incremented by one, and "n" expresses the multiple ratio.

The expression (7) is derived as follows. The cycle Te of reference clock REF.CLK and the cycle Tf of multiplication clock N-OUT after lock are expressed by the following equations (9) and (10), respectively.

$$Te = 2 \times t \times c \quad (9)$$

$$Tf = 2(t + x3\Delta d) \quad (10)$$

Since there is the relation of Te=Tf×n, the expression (7) is derived.

The expression (7) can be also programmed by the user of information processing apparatus 1. The user can therefore adjust a constant and an expression itself in an actual use state, so that flexible and high-precision setting of a count value is realized.

Without performing a strict arithmetic operation as described above, when digital PLL circuit 10A is oscillated, for example, at the multiple of 4, and the number of pulses of multiplied clock N-OUT in one cycle of reference clock REF.CLK is 8, it is possible to double the present count value and set the doubled count value to the digital counter of multiplication circuit 20A.

Figure 18:
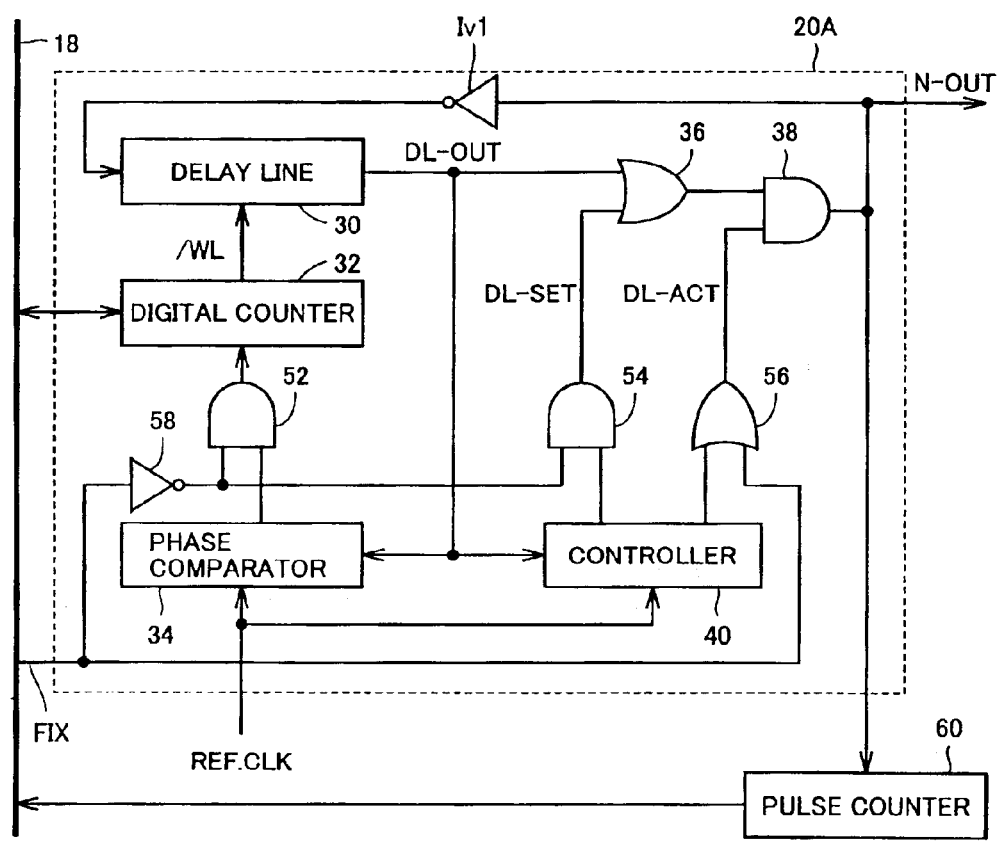
FIG. 18 is a functional block diagram for describing the function of a multiplication circuit in FIG. 17.

FIG. 18 is a functional block diagram for describing the function of multiplication circuit 20A shown in FIG. 17.

Referring to FIG. 18, multiplication circuit 20A includes the components of multiplication circuit 20 in the first embodiment shown in FIG. 2 and, in addition, AND gates 52 and 54, an OR gate 56 and an inverter 58.

AND gate 52 computes the AND of output signals from inverter 58 and phase comparator 34 and outputs the result. AND gate 54 computes the AND of output signals of inverter 58 and controller 40 and outputs the result as signal DL-SET. OR gate 56 computes the OR of an output signal from controller 40 and counter fixing signal FIX and outputs the result as signal DL-ACT. Inverter 58 outputs a signal obtained by inverting counter fixing signal FIX.

In multiplication circuit 20A, when counter fixing signal FIX received from CPU 12 via internal bus 18 goes high, an output signal of AND gate 52 goes low irrespective of an output signal from phase comparator 34, an output signal from phase comparator 34 is masked, and a count value of digital counter 32 is fixed. Signals DL-SET and DL-ACT as output signals of AND gate 54 and OR gate 56 go low and high, respectively, and a ring oscillator constructed by delay line 30, OR gate 36, AND gate 38, and inverter Iv1 oscillates.

When the information processing apparatus is used at the same frequency in the same system, it is assumed that the count value of the digital counter is almost constant. If a value once measured by pulse counter 60 is stored in storage unit 13 in a nonvolatile manner, when the operation is started next, it is sufficient to use the value and it is unnecessary to perform new measurement by pulse counter 60.

In such a case, storage unit 13 may take the form of a flash memory as described above or a fuse circuit as shown in FIG. 20. By laser-trimming a fuse element 130 in the fuse circuit, a measured count value may be stored. In such a manner as well, the value once measured by pulse counter 60 is stored in a nonvolatile manner and it becomes unnecessary to perform new measurement.

As described above, in information processing apparatus 1D according to the fourth embodiment, a proper count value is computed by using a pulse count value measured by pulse counter 60. Thus, the operation of digital PLL circuit 10 can be stabilized early immediately after start of the system and power which is consumed at the time of locking operation can be also reduced.

Fifth Embodiment

Figure 19:
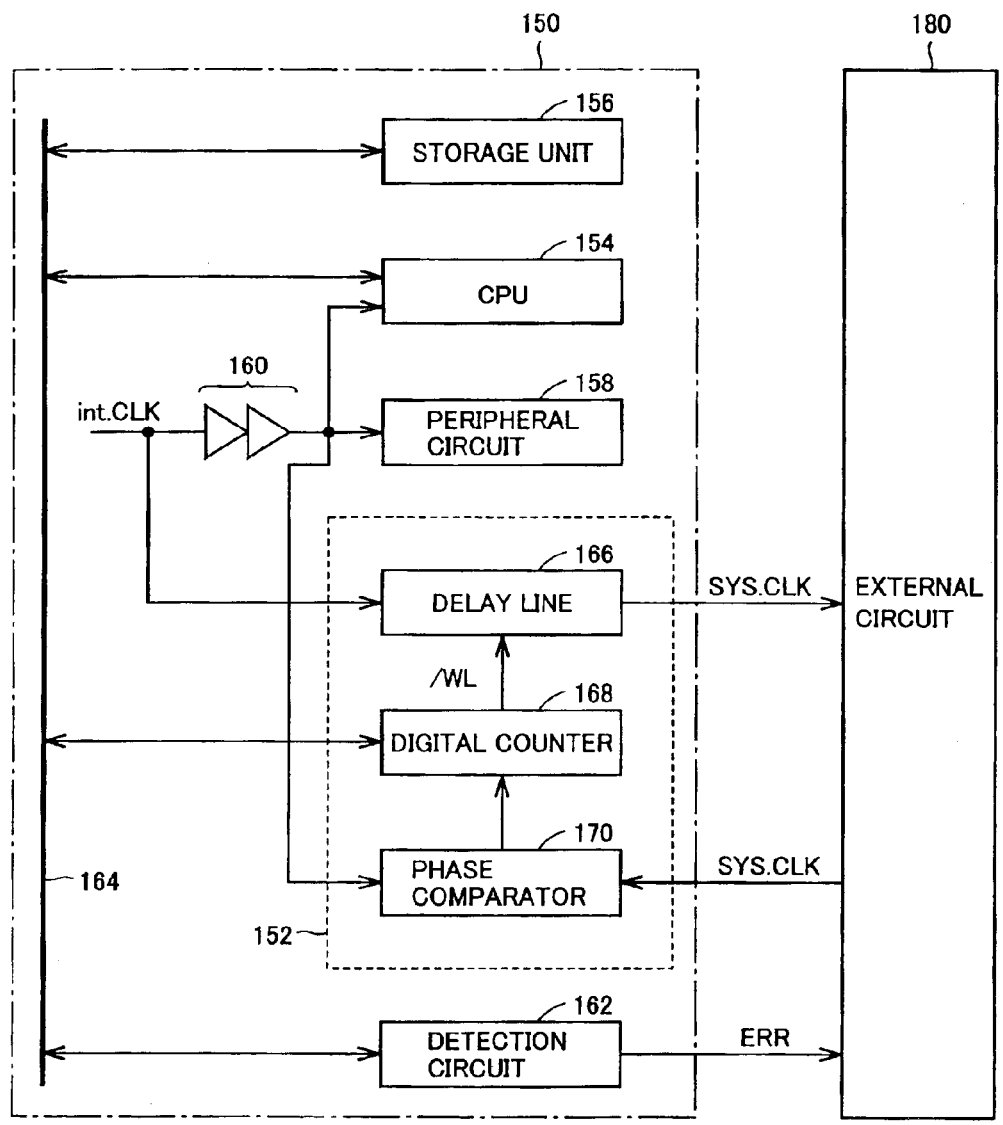
FIG. 19 is a functional block diagram for schematically describing the main part of the information processing apparatus according to a fifth embodiment of the present invention.

FIG. 19 is a functional block diagram for schematically describing the main part of an information processing apparatus according to a fifth embodiment of the present invention.

Referring to FIG. 19, an information processing apparatus 150 has a DLL circuit 152, a CPU 154, a storage unit 156, a peripheral circuit 158, a buffer 160, a detection circuit 162 and an internal bus 164. DLL circuit 152 includes a delay line 166, a digital counter 168 and a phase comparator 170.

DLL circuit 152 has the same circuit configuration as that of phase synchronization circuit 22 described in the first embodiment except for input/output signals. Specifically, delay line 166 receives an internal clock int.CLK, delays internal clock int.CLK only by delay time specified by delay signal /WL received from digital counter 168, and outputs a system clock SYS.CLK to an external circuit 180.

Digital counter 168 increments/decrements the count value in accordance with a comparison result of phase comparator 170 and outputs delay signal /WL specifying the delay amount of delay line 166 to delay line 166. Digital counter 168 is connected to internal bus 164, outputs the count value to internal bus 164 in accordance with an instruction from CPU 154, and internally sets the count value received from CPU 154 via internal bus 164.

Phase comparator 170 compares the phase of system clock SYS.CLK received from external circuit 180 with the phase of the internal clock supplied to CPU 154 and peripheral circuit 158. If the phase of system clock SYS.CLK advances, phase comparator 170 outputs a count value increment instruction to digital counter 32. On the other hand, if the phase of system clock SYS.CLK delays, phase comparator 170 outputs a count value decrement instruction to digital counter 32.

Peripheral circuit 158 generically show circuits in information processing apparatus 150 except for DLL circuit 152, CPU 154, storage unit 156, buffer 160 and detection circuit 162 shown in FIG. 19.

Storage unit 156 takes the form of a nonvolatile readable/writable storing device which is, for example, a flash memory. Storage unit 156 stores count values read from digital counter 168 by CPU 154. Storage unit 156 also stores an arithmetic expression of a count value calculated by CPU 154.

Detection circuit 162 receives the count value of digital counter 168 via internal buffer 164 in a real-time manner and always monitors. When detection circuit 162 detects that the count value overflows or underflows, detection circuit 162 outputs an interrupt signal to CPU 154 via internal bus 164 and outputs error signal ERR to external circuit 180.

CPU 154 transmits/receives data to/from digital counter 168, storage unit 156 and detection circuit 162 via internal bus 164. CPU 154 reads the count value from digital counter 168 via internal bus 164 at predetermined timings and writes the read count value into storage unit 156 via internal bus 164 as necessary. At the time of locking operation of DLL circuit 152, CPU 154 sets into digital counter 168 via internal bus 164 either the count value read from storage unit 156 via internal bus 164 or the count value calculated on the basis of the predetermined arithmetic expression read from storage unit 156 via internal bus 164.

When an interrupt signal is received from detection circuit 162, CPU 154 can take various countermeasures. For example, CPU 154 can obtain a normal state by controlling an internal power source generating apparatus or an external power source apparatus, thereby stabilizing or changing the voltage. When a cooling apparatus is provided on the outside of information processing apparatus 150, CPU 154 controls the cooling apparatus to reset the temperature into a normal range, thereby enabling a normal state to be obtained again. Further, CPU 154 controls power consumption by stopping a part of peripheral circuit 158, thereby enabling a normal state to be obtained again.

The predetermined arithmetic operation and various countermeasures are executed/taken in accordance with a program set by the user. Specifically, the user of information processing apparatus 150 preliminarily generates programs corresponding to the predetermined arithmetic operation and various countermeasures executed/taken by CPU 154 and stores the programs in storage unit 156. Therefore, the user can make settings and take various countermeasures adapted to an actual use state, so that the system having high flexibility is realized.

Internal bus 164 is connected to CPU 154, storage unit 156, digital counter 168 and detection circuit 162, and transmits data which is transmitted/received among the circuits.

In the case where the operation specifications of information processing apparatus 150 are fixed and the count value of the digital counter in a locked state is preliminarily known more or less, the count value may be stored in storage unit 156 and, after activation or resetting of the system, CPU 154 may read the count value from storage unit 156 and set the count value in digital counter 168.

In the case where information processing apparatus 150 shifts to a low power mode, DLL circuit 152 is stopped and, after that, information processing apparatus 150 returns from the low power mode, or in the case where the frequency of internal clock int.CLK is changed, information processing apparatus 150 executes the same operation as that in the operation flow of digital PLL circuit 10 in the first embodiment shown in FIGS. 10, 11 and 12.

In the case where a system on which information processing apparatus 150 is mounted is, for example, like a system using a memory card, when the capacity of external circuit 180 changes according to whether the memory card is attached or not, the phase of system clock SYS.CLK changed, so that it is necessary to lock DLL circuit 152 again.

In information processing apparatus 150, when the capacity of external circuit 180 largely changes due to attachment/detachment of the memory card or the like, CPU 154 reads a count value before the change from digital counter 168 via internal bus 164 and writes the read count value into storage unit 156. When the memory card is attached/detached again and the capacity of external circuit 180 becomes the original capacity, CPU 154 reads out the count value stored before the change from storage unit 156 and outputs the count value to digital counter 168 via internal bus 164.

In the case where the change in the capacity of external circuit 180 is almost determined such as the case of attachment/detachment of the memory card, the count values before and after a change in the capacity of external circuit 180 are often known more or less. It is consequently possible to detect attachment/detachment of a memory card by CPU 154, read a prestored count value from storage unit 156, and set the read count value into digital counter 168, or calculate a count value after the change in capacity by using a predetermined function on the basis of the count value before the change in capacity due to attachment/detaching by CPU 154 and set the calculated count value into digital counter 168.

In a case such that a memory card is frequently attached/detached, waiting time due to the locking operation after the attachment/detachment of the memory card is shortened. Thus, the processing performance is improved, and power consumption required for the locking operation is reduced.

When a plurality of DLL circuits exist in the information processing apparatus, in a manner similar to the second embodiment in the digital PLL circuit, the count value of the DLL circuit in a locked state may be set to the other DLL circuit to be locked. With the configuration, when the operation condition of one of DLL circuits is changed, lock time is shortened, the processing performance is improved, and power consumption required for the locking operation is reduced.

In the fifth embodiment, the DLL circuit is used for system clock SYS.CLK. Also in the case where the DLL circuit is used for making the internal clock used in CPU 154 and peripheral circuit 158 synchronized with system clock SYS.CLK by using system clock SYS.CLK supplied from the outside as a reference, similar effects are produced.

As described above, in information processing apparatus 150 according to the fifth embodiment, the count value of the digital counter in DLL circuit 152 can be properly set by CPU 154 on the basis of an instruction from the user, so that proper setting can be made flexibly in accordance with a change in the operating state of DLL circuit 152. As a result, the operation of DLL circuit 152 can be stabilized early.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An information processing apparatus comprising:
    a clock generating circuit generating an internal clock signal having a frequency which is the same as or is a multiple ratio of a frequency of a reference clock signal by changing an oscillating cycle of a clock signal; and
    a control circuit setting a first initial value in said clock generating circuit on the basis of a first instruction from the outside, wherein
    said clock generating circuit includes a multiplication circuit, and said multiplication circuit includes:
    a first counter receiving said first initial value from said control circuit, adjusting a first count value to specify said oscillating cycle of said clock signal by using said first initial value as a first initial count value, and outputting said first count value; and
    an oscillation circuit receiving said first count value from said first counter and oscillating said clock signal on the basis of said first count value.

2. The information processing apparatus according to claim 1, wherein
    at the time of system activation or reset, said control circuit sets a predetermined count value, which is prestored, as said first initial value into said first counter.

3. The information processing apparatus according to claim 1, wherein
    when said clock generating circuit stops and, then, operates again, said control circuit sets said first count value read from said first counter before the stop as said first initial value into said first counter.

4. The information processing apparatus according to claim 1, wherein
    when the frequency of said reference clock signal is changed, said control circuit calculates said first initial value on the basis of said first count value read from said first counter before the change and the frequencies of said reference clock signal before and after the change, and sets said calculated first initial value into said first counter.

5. The information processing apparatus according to claim 1, wherein when a multiple ratio between said reference clock signal and said internal clock signal is changed, said control circuit calculates said first initial value on the basis of said first count value read from said first counter before the change and said multiple ratio before and after the change, and sets said calculated first initial value into said first counter.

6. The information processing apparatus according to claim 1, further comprising:
a detection circuit detecting that said first count value of said first counter lies out of a predetermined range and notifying said control circuit of a detection result, wherein
said control circuit uses, in response to receiving signal detection result, said reference clock signal in place of said internal clock signal as an operation clock signal of the information processing apparatus.

7. The information processing apparatus according to claim 6, wherein said detection circuit notifies of said detection result to the outside.

8. The information processing apparatus according to claim 1, further comprising:
a detection circuit detecting that said first count value of said first counter lies out of a predetermined range and notifying said control circuit of a detection result, wherein
said control circuit, in response to receiving said detection result, changes a multiple ratio between said reference clock signal and said internal clock signal so that said first count value lies within said predetermined range.

9. The information processing apparatus according to claim 1, further comprising
a pulse counter counting the number of pulses of said clock signal, wherein
said control circuit calculates said first initial value on the basis of a pulse count value counted by said pulse counter in a predetermined period and sets said calculated first initial value into said first counter.

10. The information processing apparatus according to claim 9, further comprising:
a storage circuit storing data, wherein
said control circuit writes said calculated first initial value into said storage circuit and, at the time of system activation or reset, sets said first initial value read from said storage circuit into said first counter.

11. The information processing apparatus according to claim 9, further comprising:
a fuse circuit including a fuse element, wherein
said fuse element in said fuse circuit is disconnected on the basis of said pulse count value, and
at the time of system activation or reset, said control circuit calculates said first initial value on the basis of said pulse count value determined on the basis of a disconnection state of said fuse element.

12. The information processing apparatus according to claim 1, wherein
said clock generating circuit further includes a phase synchronization circuit synchronizing a phase of said internal clock signal with a phase of said reference clock signal,
said control circuit further sets a second initial value into said phase synchronization circuit on the basis of a second instruction from the outside, and
said phase synchronization circuit includes:
a phase comparator comparing said phase of said internal clock signal with said phase of said reference clock signal;
a second counter receiving a phase comparison result and said second initial value from said phase comparator and said control circuit, respectively, adjusting a second count value to specify a delay amount of said clock signal received from said oscillation circuit by using said second initial value as a second initial count value on the basis of said phase comparison result, and outputting said second count value; and
a variable delay circuit receiving said second count value from said second counter, delaying said clock signal received from said oscillation circuit on the basis of said second count value, and outputting said internal clock signal.

13. The information processing apparatus according to claim 12, wherein
at the time of system activation or reset, said control circuit sets a predetermined count value, which is prestored, as said second initial value into said second counter.

14. The information processing apparatus according to claim 12, wherein
when said clock generating circuit stops and, then, operates again, said control circuit sets said second count value read from said second counter before the stop as said second initial value into said second counter.

15. The information processing apparatus according to claim 12, further comprising:
another clock generating circuit generating another internal clock signal having a frequency which is the same as or is a multiple of the frequency of said reference clock signal by changing an oscillating cycle of another clock signal, wherein
said control circuit further sets third and fourth initial values into said another clock generating circuit on the basis of third and fourth instructions, respectively, from the outside,
said another clock generating circuit includes:
a third counter receiving said third initial value from said control circuit, adjusting a third count value to specify said oscillating cycle of said another clock signal by using said third initial value as a third initial count value, and outputting said third count value;
another oscillation circuit receiving said third count value from said third counter and oscillating said another clock signal on the basis of said third count value; and
another phase synchronization circuit synchronizing a phase of said another internal clock signal with a phase of said reference clock signal, and
said another phase synchronization circuit includes:
another phase comparator comparing said phase of said another internal clock signal with said phase of said reference clock signal;
a fourth counter receiving a phase comparison result and said fourth initial value from said another phase comparator and said control circuit, respectively, adjusting a fourth count value to specify a delay amount of said another clock signal received from said another oscillation circuit by using said fourth initial value as a fourth initial count value on the basis of said phase comparison result, and outputting said fourth count value; and
another variable delay circuit receiving said fourth count value from said fourth counter, delaying said another clock signal received from said another oscillation circuit on the basis of said fourth count value, and outputting said another internal clock signal, and when an operation setting of said another clock generating circuit is changed to the same condition as that of said clock generating circuit, said control circuit calculates said third initial value after the change on the basis of said first count value read from said first counter before the change, sets said calculated third initial value into said third counter, and sets said second count value read from said second counter before the change as said fourth initial value into said fourth counter.

16. The information processing apparatus according to claim 1, further comprising:

another clock generating circuit generating another internal clock signal having a frequency which is the same as or is a multiple of the frequency of said reference clock signal by changing an oscillating cycle of another clock signal, wherein said control circuit further sets a second initial value into said another clock generating circuit on the basis of a second instruction from the outside, said another clock generating circuit includes:

a second counter receiving said second initial value from said control circuit, adjusting a second count value to specify said oscillating cycle of said another clock signal by using said second initial value as a second initial count value, and outputting said second count value; and another oscillation circuit receiving said second count value from said second counter and oscillating said another clock signal on the basis of said second count value, and when an operation setting of said another clock generating circuit is changed to the same condition as that of said clock generating circuit, said control circuit calculates said second initial value after the change on the basis of said first count value read from said first counter before the change and sets said calculated second initial value into said second counter.

17. An information processing apparatus comprising:

a clock delay circuit delaying a first clock signal to synchronize said first clock signal with a second clock signal; and a control circuit setting an initial value in said clock delay circuit on the basis of a first instruction from the outside, wherein said clock delay circuit includes:

a phase comparator comparing a phase of said first clock signal with a phase of said second clock signal;

a counter receiving a phase comparison result and said initial value from said phase comparator and said control circuit, respectively, adjusting a count value to specify a delay amount of said first clock signal by using said initial value as a first initial count value on the basis of said phase comparison result, and outputting said adjusted count value; and a variable delay circuit receiving said count value from said counter and delaying said first clock signal on the basis of said count value.

18. The information processing apparatus according to claim 17, wherein when said clock delay circuit stops and, then, operates again, said control circuit sets said count value read from said counter before said clock delay circuit stops as said initial value into said counter.

19. The information processing apparatus according to claim 17, wherein when a load capacity of a load circuit changes and, then, returns to the state before the change, said control circuit sets said count value read from said counter before the change as said initial value into said counter.

20. The information processing apparatus according to claim 17, further comprising:

another clock delay circuit delaying a third clock signal to synchronize said third clock signal with a fourth clock signal, wherein said control circuit further sets another initial value in said another clock delay circuit on the basis of a second instruction from the outside, said another clock delay circuit includes:

another phase comparator comparing a phase of said third clock signal with a phase of said fourth clock signal;

another counter receiving a phase comparison result and said another initial value from said another phase comparator and said control circuit, respectively, adjusting another count value to specify a delay amount of said third clock signal by using said another initial value as a second initial count value on the basis of said phase comparison result, and outputting said adjusted another count value; and another variable delay circuit receiving said another count value from said another counter and delaying said third clock signal on the basis of said another count value, and when an operation setting of said another clock delay circuit is changed to the same condition as that of said clock delay circuit, said control circuit sets said count value read from said counter before the change as said another initial value into said another counter.

* * * * *